United States Patent [19]

Uratani

[11] Patent Number: 4,684,829

[45] Date of Patent: Aug. 4, 1987

[54] CMOS TREE DECODER WITH SPEED ENHANCEMENT BY ADJUSTMENT OF GATE WIDTH

[75] Inventor: Munehiro Uratani, Kashiwara, Japan

[73] Assignee: Sharp Kabushiki Kaisha, Osaka, Japan

[21] Appl. No.: 629,338

[22] Filed: Jul. 10, 1984

[30] Foreign Application Priority Data

Jul. 12, 1983 [JP] Japan .................. 58-127396

[51] Int. Cl.$^4$ .................. H03K 19/017; H03K 19/094
[52] U.S. Cl. .................. 307/449; 307/443; 307/451; 307/463
[58] Field of Search ............... 307/443, 448, 449, 451, 307/463, 468, 469; 364/716

[56] References Cited

U.S. PATENT DOCUMENTS

| | | | |
|---|---|---|---|
| 3,355,598 | 11/1967 | Tuska | 307/463 |
| 3,539,823 | 11/1970 | Zuk | 307/451 |
| 4,140,924 | 2/1979 | Oguey et al. | 307/451 X |
| 4,176,287 | 11/1979 | Remedi | 307/463 |
| 4,430,583 | 2/1984 | Shoji | 307/448 |
| 4,491,839 | 1/1985 | Adam | 307/451 X |

OTHER PUBLICATIONS

Kenyon et al, "Complementary Field-Effect Transistor High-Density Decoder", *IBM-TDB*; vol. 15, No. 9, pp. 2823-2824, 2/1973.
Gersbach et al, "Cascode Decoder"; *IBM-TDB*, vol. 8, No. 4, pp. 642-643; 9/1965.
Herzog; "COS/MOS: the Best of Both Worlds"; *Electronics*; 2/17/1969; pp. 109-112.

Primary Examiner—Stanley D. Miller
Assistant Examiner—D. R. Hudspeth
Attorney, Agent, or Firm—Birch, Stewart, Kolasch & Birch

[57] ABSTRACT

A semi-conductor decoder circuit includes $2^{N-1}$ circuits each formed of transistors vertically arranged in N stages, with the transistors of $2^{N-1}, 2^{N-2} \ldots 2^1, 2^0$ number being disposed sequentially from the output stage in N stages in a tree structure. The gate width of the transistor at each stage is expanded as a distance from the output stage is increased so as to prevent an increase in ON resistance of the circuit and also to achieve a high speed operation.

4 Claims, 9 Drawing Figures

CMOS TREE DECODER WITH SPEED ENHANCEMENT BY ADJUSTMENT OF GATE WIDTH

BACKGROUND OF THE INVENTION

The present invention generally relates to a semi-conductor decoder circuit and more particularly, to a decoder circuit for a memory circuit constructed with CMOS (complementary metal oxide semi-conductor) transistors.

Following the recent rapid progress in processing techniques, there has been a marked increase in the memory capacity of a semi-conductor memory, while memory cell size has tended to decrease in inverse proportion to the memory capacity owing to the restriction in the chip size.

Generally, in an asynchronous CMOS memory, the decoder section is constituted by NAND circuits as shown in FIG. 1, and for the NAND circuits of this kind, there are employed circuits constructed of NMOS (n-channel metal oxide semi-conductor) transistors connected to each other so as to be vertically arranged. However, the NAND circuit construction as described above has such a disadvantage that its ON resistance is undesirably increased, with a consequent prolonged discharge time. Moreover, following the reduction of the memory cell size owing to the reason described earlier, the gate width of the NMOS transistor becomes still smaller in an ordinary layout system, and therefore, the inconvenience that the discharge time is prolonged still further, can not be avoided.

More specifically, in the decoder section of the asynchronous CMOS memory as illustrated in FIG. 1, although there are provided the NAND circuits respectively applied with N inputs of $A'_1$ to $A'_N$, these N input NAND circuits $NAND_1$, $NAND_2$, ... and $NAND_K$ present an obstacle for high speed operation, and therefore, various proposals have been made up to the present time to modify circuit construction and layout systems in order to eliminate the disadvantage as described above.

In FIG. 2, there is shown the simplest construction of a CMOS N input NAND circuit conventionally employed, in which N number of PMOS (p-channel metal oxide semi-conductor) transistors PT are connected in parallel to each other, while N number of NMOS transistors NT are connected to be vertically arranged in series with each other between a common junction j of said PMOS transistors PT and the ground, with input signals $\overline{A}'_i/A'_i$ (i=1 through N) being applied to respective gates of said PMOS transistors PT and NMOS transistors NT so as to function as the NAND circuit.

In FIG. 3, showing a layout pattern of an arrangement of the above NAND circuits, for example, $NAND_1$ and $NAND_2$, regions surrounded by solid lines are diffusion areas 1 and 2, and 2N pieces of signal lines $\overline{A}'_1$, $A'_1$ ... $\overline{A}'_N$, $A'_N$ are formed by Al wiring, while polysilicon layers 3 (shown by hatched lines) are further formed on gate insulating films forming the NMOS transistors NT so as to overlap the Al wiring. In FIG. 3, marks ⊚ represent contact holes for establishing connections between the Al wiring and the polysilicon layers 3 of the NMOS transistor gate electrodes, and marks x show connections between the Al wiring and the diffusion areas 1 and 2. In the circuit arrangement of FIG. 3, N pieces of NMOS transistors NT are employed per one NAND circuit, and the gate width of each transistor must be accommodated within a memory cell length LMC. On the assumption that the gate width of the NMOS transistor equivalent to the memory cell length LMC is denoted by $W_M$, the substantial gate width $W_1$ for the NMOS portion which must be vertically arranged is represented by an equation, $$W_1 = \frac{1}{1/W_M + 1/W_M + \ldots + 1/W_M} = \frac{1}{N} W_M \quad (1)$$

Subsequently, FIG. 4 shows an improved circuit of the conventional circuit of FIG. 2, while FIG. 5 represents a layout pattern thereof. In FIG. 4, (N+1)/2 pieces of NMOS transistors NT are employed for one NAND circuit, and the gate widths of the transistors having $\overline{A}'_2/A'_2$ to $\overline{A}'_N/A'_N$ as the inputs can be expanded to a value equivalent to 2LMC. Although the MOS transistor having the gate width larger than that in the conventional circuit of FIG. 2 may be obtained by the above arrangement, the substantial gate width $W_2$ in this case is merely one represented by an equation, $$W_2 = \frac{1}{1/W_M + 1/2W_M + \ldots + 1/2W_M} = \frac{2}{N+1} W_M \quad (2)$$

and it can not be said that a fully satisfactory improvement has been achieved, even with respect to the circuits vertically arranged in multi-stages, and thus, a sufficiently high speed operation has not been achieved as yet by any of the conventional systems due to the hindrance resulting from the vertically staged connection of NMOS transistors.

SUMMARY OF THE INVENTION

Accordingly, an essential object of the present invention is to provide a semi-conductor decoder circuit in which multi-staged NMOS transistors are connected to each other into a tree structure, the tree structure being so arranged that the gate width is increased to be equivalent to one, two, four times ... and so forth of the memory cell length, starting from the transistor at the side closer to the output stage for the expansion of the gate width, thereby prevents an increase of ON resistance of the circuit and also, to achieve a high speed operation.

Another important object of the present invention is to provide a semi-conductor decoder circuit of the above described type which is simple in construction and highly reliable in operation, and can be readily incorporated into various electronic circuits at low cost.

In accomplishing these and other objects, according to one preferred embodiment of the present invention, there is provided a semi-conductor decoder circuit which includes $2^{N-1}$ circuits each formed of transistors vertically arranged in N stages, characterized in that the transistors of $2^{N-1}$, $2^{N-2}$ ... $2^1$, $2^0$ pieces are disposed sequentially from the output stage in N stages in a tree structure, with gate width of the transistor at each stage being formed to be expanded as a distance from the output stage is increased.

By the circuit construction according to the present invention as described above, an improved semiconductor decoder circuit has been advantageously presented, with a substantial elimination of disadvantages inherent in the conventional circuits of this kind.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
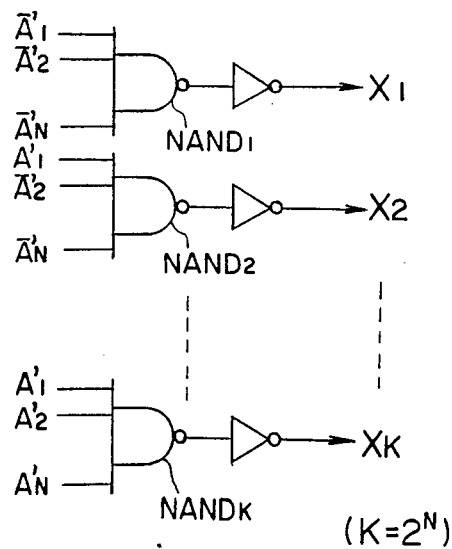
FIG. 1 is a block circuit diagram showing the construction of a decoder section of an asynchronous CMOS memory (already referred to)
Figure 2:
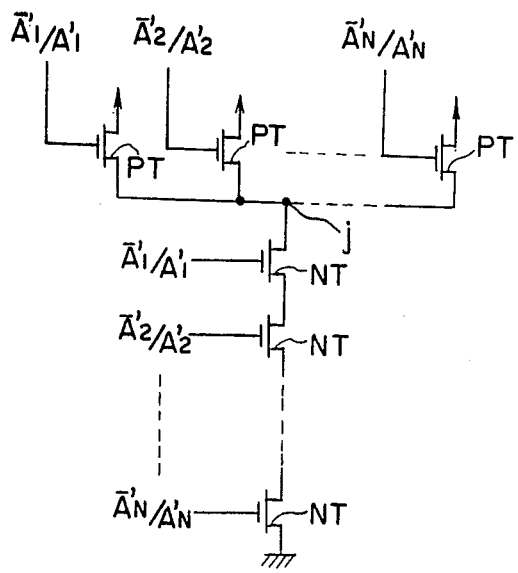
FIG. 2 is a circuit diagram showing the simple construction of CMOS N input NAND circuits conventionally employed (already referred to)
Figure 3:
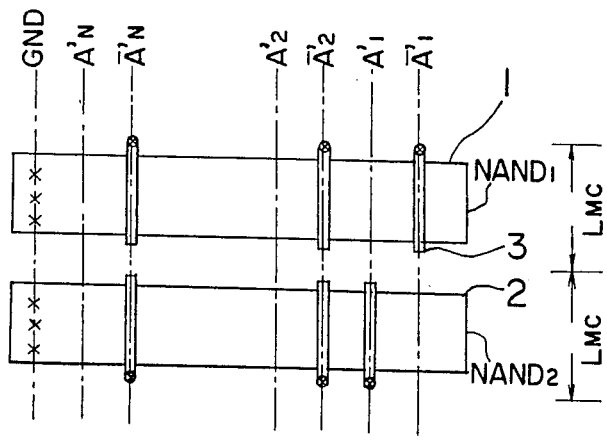
FIG. 3 is a diagram showing a layout pattern of the conventional circuit of FIG. 2 (already referred to)

Before the description of the present invention proceeds, it is to be noted that like parts are designated by like reference numerals throughout the accompanying drawings.

Figure 6:
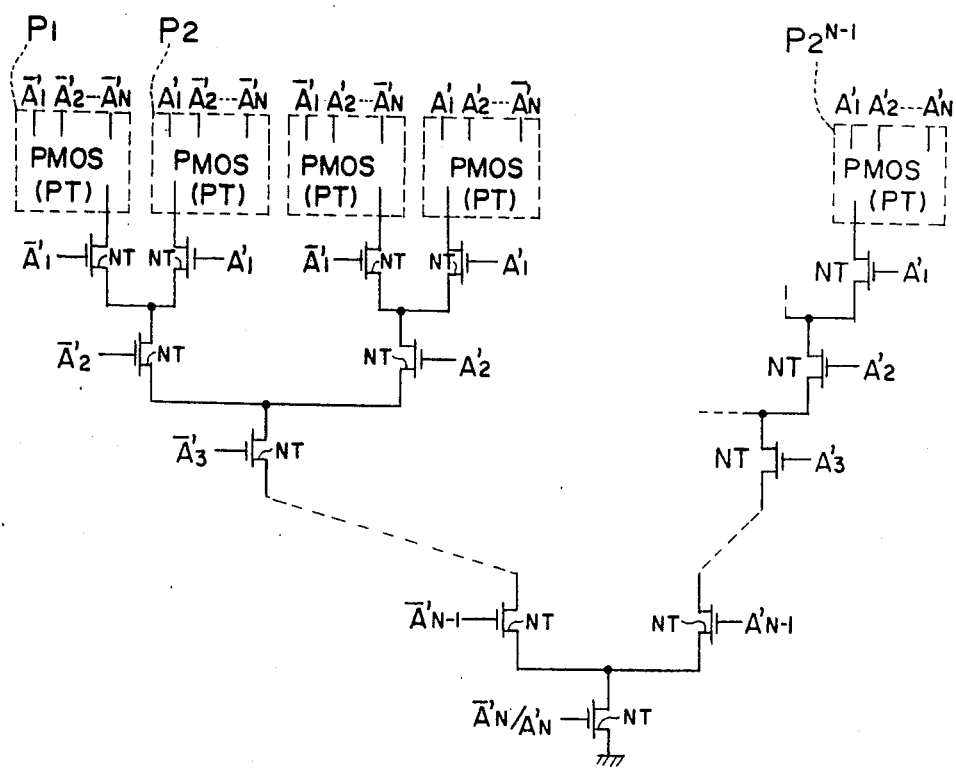
FIG. 6 is a circuit diagram showing the construction of a semi-conductor decoder circuit according to one preferred embodiment of the present invention.

Referring now to the drawings, there is shown in FIG. 6 a semi-conductor decoder circuit according to one preferred embodiment of the present invention. The decoder circuit of FIG. 6 is formed of CMOS transistors and generally includes PMOS transistor sections $P_1$ to $P_{2N-1}$ which each include, with respect to N inputs $A'_1$ to $A'_N$, N number of PMOS transistors PT. These PMOS transistors have applied, at their gates, inverted or non-inverted inputs which are respectively connected in parallel to each other. The decoder circuit generally further includes NMOS transistor sections in which NMOS transistors NT are connected at subsequent stages of the $2^{N-1}$ number of PMOS transistor sections $P_1$ to $P_{2N-1}$ in the form of a tree structure as illustrated. In the NMOS transistor sections, the tree structure is so constructed that the transistors NT are connected to each other, in vertical stages, by successively being reduced in the number thereof in such an order as $2^{N-1}$ number of NMOS transistors NT applied with inputs $\overline{A}'_1/A'_1$, and then, $2^{N-2}$ number of NMOS transistors NT applied with inputs $\overline{A}'_2/A'_2$ up to one NMOS transistor NT applied with inputs $\overline{A}'_N/A'_N$ at the final stage.

Figure 7:
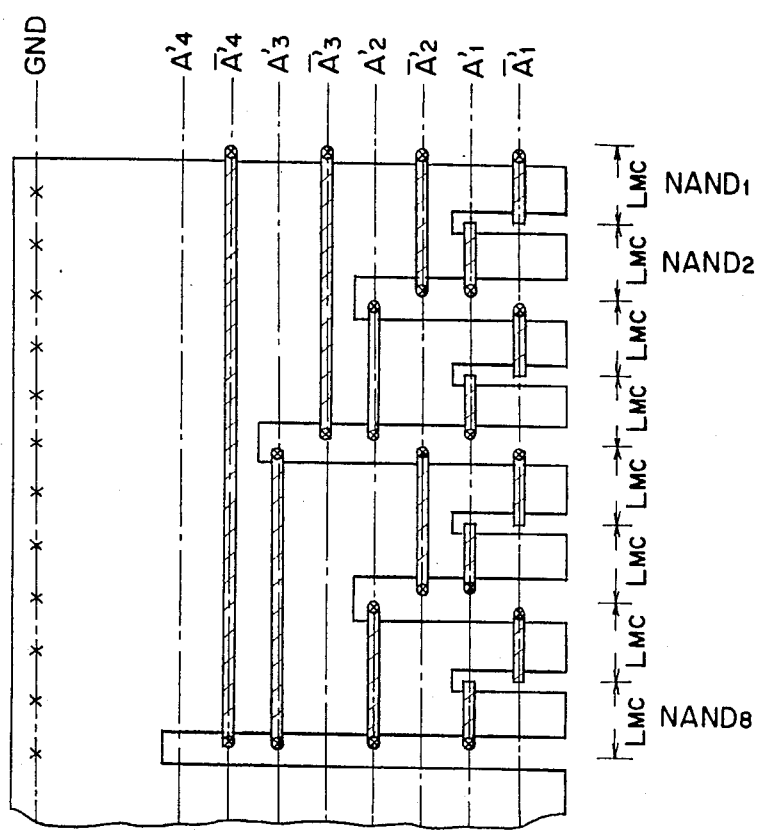
FIG. 7 is a diagram showing a layout pattern of the semi-conductor decoder circuit of FIG. 6.

FIG. 7 shows a layout pattern of the NMOS transistor section as illustrated in FIG. 6. More specifically, on the assumption that a gate width of the NMOS transistor NT applied with the inputs $\overline{A}'_1/A'_1$ is represented by one memory cell length LMC, the gate width of the NMOS transistor NT applied with the inputs $\overline{A}'_2/A'_2$ becomes $2^1 \times$LMC, the gate width of the NMOS transistor NT applied with the inputs $\overline{A}'_3/A'_3$ is $2^2 \times$LMC, and the gate width of the NMOS transistor NT applied with the inputs $\overline{A}'_i/A'_i$ will be $2^{i-1} \times$LMC. In such a manner, the NMOS transistors NT included in $2^{N-1}$ number of NAND circuits are collectively formed to provide the gate widths and diffusion areas meeting the dimensions as described above. In other words, in the tree structure for NMOS transistor NT of N stages, the gate width is increased as a distance from the output stage is increased.

Figure 4:
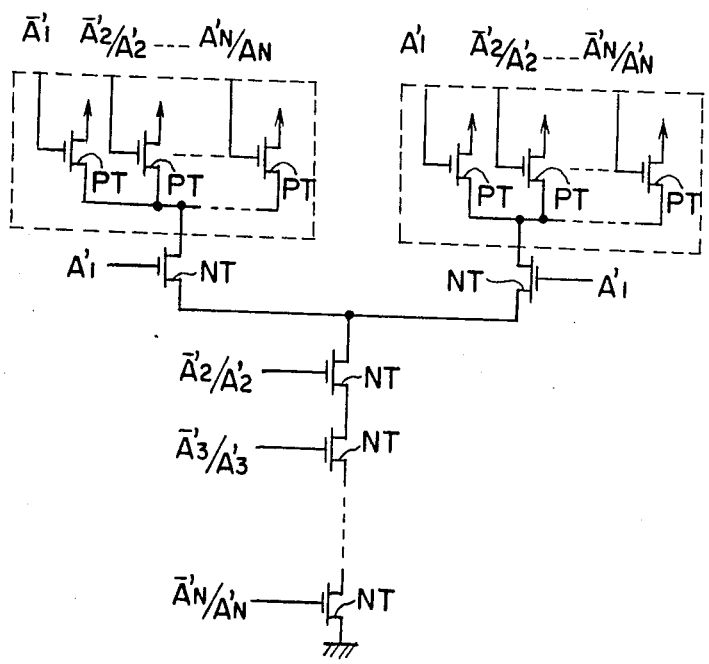
FIG. 4 is a circuit diagram similar to FIG. 2, which shows a conventional improvement thereof (already referred to)
Figure 5:
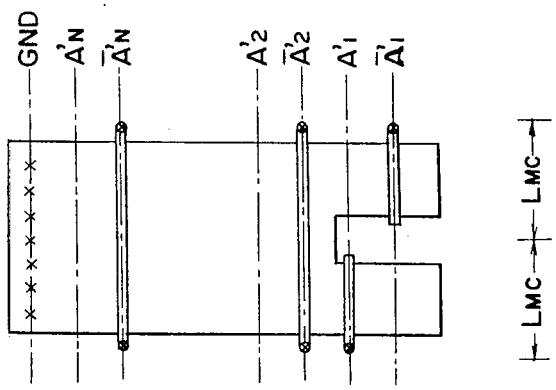
FIG. 5 is a diagram showing a layout pattern of the conventional circuit of FIG. 4 (already referred to)

In the above layout pattern of FIG. 7, although the gate widths are similar to those shown in the conventional circuit of FIG. 4 with respect to the NMOS transistors NT applied with the inputs $\overline{A}'_1/A'_1$ and $\overline{A}'_2/A'_2$, the gate widths may be expanded in such a manner that 4LMC, 8LMC, ... and so forth with respect to the inputs $\overline{A}'_3/A'_3$ and thereafter, and the substantial gate width $W_3$ may be represented by, $$W_3 = \frac{1}{1/W_M + 1/2W_M + \ldots + 1/2^{N-1}W_M} = \frac{1}{2\{1 - (\frac{1}{2})^N\}} W_M \quad (3)$$

Figure 8:
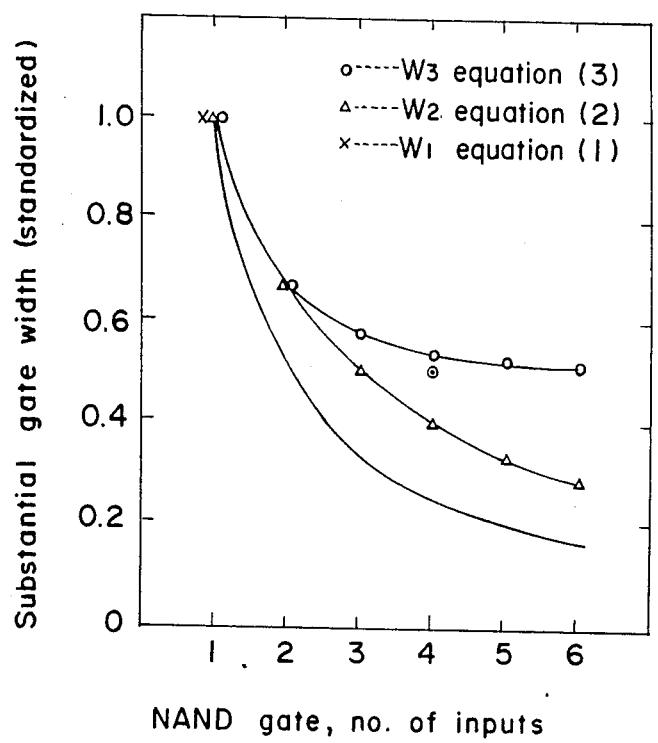
FIG. 8 is a graphical diagram showing the relation between the number of inputs for NAND gate and substantial gate width for comparison of the conventional circuit with the embodiment according to the present invention.

Referring also to FIG. 8, there is shown a graphical diagram representing the relation between the NAND gate, number of inputs in the foregoing equations (1), (2) and (3) and the substantial gate widths. As is seen from FIG. 8, it has been found that, although the gate widths $W_1$ and $W_2$ are rapidly decreased as the number of inputs to the NAND gate is increased, the gate width $W_3$ is hardly changed in the circuit construction of the embodiment according to the present invention in the case where the number of stages N is in the relation $N \geq 4$. The above finding shows that the feature of the present embodiment is more clearly displayed with an increase of the memory capacity.

Figure 9:
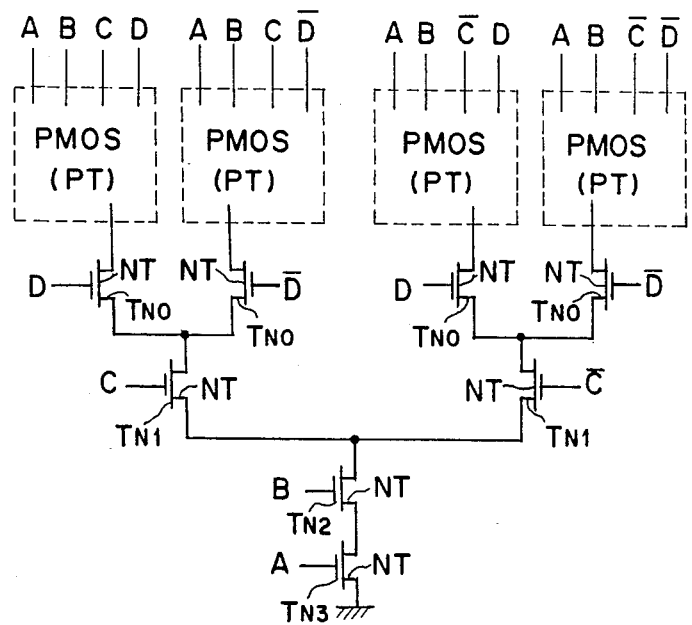
FIG. 9 is a diagram similar to FIG. 6, which particularly shows a modification thereof.

Referring further to FIG. 9, there is shown a decoder circuit according to a modification of the present invention, which is more specific than the embodiment of FIG. 6. In the modification of FIG. 9, it has been so arranged that each NMOS transistor TNO at the output stage side has a gate width equivalent to one memory cell, each NMOS transistor TN1 at the subsequent stage has a gate width equivalent to two memory cells, and NMOS transistors TN2 and TN3 are provided with gate widths equivalent to four memory cells.

The substantial gate width $W_4$ in this case is represented by $$W_4 = \frac{1}{1/W_M + 1/2W_M + 1/4W_M + 1/4W_M} = \frac{W_M}{2}$$

as denoted by a mark  in FIG. 8.

In the present embodiment, the reasons why the tree structure for the NMOS transistors is limited to the three stages without extension to four stages, with respect to the decoder circuit of four inputs, are:

(1) Since the number of inputs for the NAND gates is small at four inputs, the substantial gate width is hardly affected even if the tree structure is formed into four stages.

(2) In the case where the tree structure is formed into four stages, there is such an undesirable possibility that in the present embodiment in which the memory size is not so small, areas at the source side of the transistor TN₃ and at the drain side of the transistor TN₄ are increased, with the influence of junction capacitance at that portion beginning to be noticed.

However, when the number of stages for the tree structure is increased by the contraction of the memory size through a further advance towards a large memory capacity as in a VLSI (very large scale integration) in recent years, a combined effect with the increased number of inputs for the NAND gates may be expected, since the influence by the above junction capacitance can be reduced.

As is clear from the foregoing description, according to the present invention, even in a circuit in which a large number of MOS transistors are to be vertically connected in stages to each other, it is possible to prevent the undesirable increase of the ON resistance through expansion of the gate width, and thus, a high speed functioning can be achieved. Particularly, the present invention provides a remarkable effect when applied to a high density memory circuit in which contraction of cell size can not be avoided.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A semiconductor decoder circuit comprising:
    $2^{N-1}$ number of NAND gate means, each having N inputs and collectively developing an output, where N is greater than 2, each said NAND gate means including;
    N first transistors, each having a control terminal coupled to receive one of said N inputs and first and second controlled terminals, said first controlled terminals being commonly connected together to said output, said second controlled terminals coupled to receive a supply voltage; and
    a unique path of at least N−1 second transistors, said second transistors each having an input gate coupled to receive one of said N inputs and third and fourth controlled terminals, said N−1 second transistors in said unique path being serially connected together by their respective third and fourth terminals to form N−1 stages between said commonly connected first controlled terminals and a reference node;
    said unique path between each of said $2^{N-1}$ number of NAND gate means and said reference node sharing at least some of said N−1 second transistors with the unique path of others of said NAND gate means,
    said N−1 second transistors of all of said $2^{N-1}$ number of NAND gate means being connected in a cascade arrangement with said said unique paths intersecting to connect the N first transistors of each of said $2^{N-1}$ number of NAND gate means to said reference node at a single point;
    each gate of one of said N−1 second transistors in the N−1 stage having a gate width inversely proportional to the number of transistors in said N−1 stage to thereby make the total gate width of all of said second transistors at each said stage substantially constant.

2. The decoder circuit of claim 1 wherein said first transistors are PMOS field effect transistors.

3. The decoder circuit of claim 1 wherein said second transistors are NMOS field effect transistors.

4. The decoder circuit of claim 1 wherein said at least N−1 second transistors of each unique path comprise N second transistors.

* * * * *